(12) United States Patent
Xu et al.

(10) Patent No.: US 7,860,470 B2
(45) Date of Patent: Dec. 28, 2010

(54) CROSS COUPLED HIGH FREQUENCY BUFFER

(75) Inventors: Zhiwei Xu, Los Angeles, CA (US); Heng-Yu Jian, Los Angeles, CA (US); Yi-Cheng Wu, Los Angeles, CA (US); Charles Chien, Newbury Park, CA (US)

(73) Assignee: Silicon Storage Technology, Inc., Sunnyvale, CA (US)

( * ) Notice: Subject to any disclaimer, the term of this patent is extended or adjusted under 35 U.S.C. 154(b) by 829 days.

(21) Appl. No.: 11/781,198

(22) Filed: Jul. 20, 2007

(65) Prior Publication Data
US 2009/0023413 A1    Jan. 22, 2009

(51) Int. Cl.
*H03J 7/32* (2006.01)
(52) U.S. Cl. .................. 455/147; 455/76; 455/141; 455/333
(58) Field of Classification Search .................. 455/147
See application file for complete search history.

(56) References Cited

U.S. PATENT DOCUMENTS

| | | | |
|---|---|---|---|
| 5,140,198 A | 8/1992 | Atherly et al. | |
| 6,009,317 A | 12/1999 | Wynn | |
| 6,466,055 B1 | 10/2002 | Gaboury | |
| 6,670,900 B1 | 12/2003 | Zhang | |
| 6,735,422 B1 | 5/2004 | Baldwin et al. | |
| 6,760,577 B2 | 7/2004 | Li | |
| 6,859,075 B1 | 2/2005 | Van der Wagt | |
| 6,982,601 B2 | 1/2006 | Sibrai | |
| 7,027,792 B1 | 4/2006 | Luff et al. | |
| 7,102,411 B2 | 9/2006 | Behzad | |
| 2002/0191713 A1 | 12/2002 | McVey | |
| 2004/0032913 A1 | 2/2004 | Dinur | |
| 2004/0106380 A1 | 6/2004 | Vassiliou | |
| 2004/0198278 A1* | 10/2004 | Chien | 455/147 |
| 2004/0224654 A1* | 11/2004 | Javor et al. | 455/146 |
| 2004/0230393 A1 | 11/2004 | Anderson | |
| 2008/0032661 A1* | 2/2008 | Ojo et al. | 455/333 |

OTHER PUBLICATIONS

Kim, et al., "A New Mixer Linearization Method and Optimization of Integrated Inductor for Single Balance Mixer LO Buffer," pp. 43-46, IEEE, 2004.
Gueorguiev, et al., "Common-mode Stability in Low-Power LO Drivers," pp. 5505-5508, IEEE, 2005.
Watanabe, et al., "CMOS RF Buffer Amplifier Design," pp. 230-233, IEEE, 1999.
Banerjee, et al., "A SiGe Dual-Band Dual-Mode RF Front End With a Novel Architecture for IEEE 802.11 a/b/g Wireless LAN Applications," pp. 124-127, IEEE, 2004.
Floyd, et al., "WCDMA Direct-Conversion Receiver Front-End Comparison in RF-CMOS and SiGe BiCMOS," pp. 1181-1188, vol. 53, No. 4, IEEE, Apr. 2005.

* cited by examiner

*Primary Examiner*—Duc Nguyen
*Assistant Examiner*—Ajibola Akinyemi
(74) *Attorney, Agent, or Firm*—DLA Piper LLP (US)

(57) ABSTRACT

A local oscillator (LO) buffer circuit comprises first and second LO buffers arranged in a cross coupled configuration. The first LO buffer generates in-phase output signals in response to in-phase input signals, and quadrature output signals from the second LO buffer. The second LO buffer generates the quadrature output signals in response to quadrature input signals and the in-phase output signals. The LO buffers may include inductive loads. The LO buffers may include MOS transistors or bipolar junction transistors.

13 Claims, 6 Drawing Sheets

CROSS COUPLED HIGH FREQUENCY BUFFER

TECHNICAL FIELD

This patent application relates to high frequency buffers, and more particularly, cross coupled local oscillator buffers.

BACKGROUND

A direct conversion radio frequency (RF) transceiver may use a local oscillator (LO) and LO buffer for up conversion of in-phase (I) and quadrature (Q) signals into a transmit signal and down conversion of a received signal into in-phase and quadrature signals at baseband. IQ mismatch causes errors in the direct conversion RF transceiver. Any gain mismatch or phase mismatch in transmission and receiving deteriorate the signal quality so as affect communication quality. The LO buffer and associated LO routing typically are the major contributors of the quadrature mismatch inside the RF transceiver. To achieve good communication quality, communication systems generally have a requirement for the LO quadrature mismatch. For example, in an IEEE 802.11 a/g system, the phase mismatch should be less than one degree and the amplitude mismatch should be less than 0.1 dB. More advanced modulation methods may require lower mismatch.

SUMMARY

A LO buffer circuit comprises first and second LO buffers coupled in a cross coupled arrangement. The first LO buffer generates in-phase output signals in response to in-phase input signals and quadrature output signals from the second LO buffer. The second LO buffer generates the quadrature output signals in response to quadrature input signals and the in-phase output signals.

In one aspect, the LO buffers comprise first and second MOS transistor differential input pairs and a plurality of inductive loads. The second MOS transistor differential pair of one LO buffer receives the output of the other LO buffer. Each MOS transistor of the differential input pairs is coupled to at least one of the plurality of inductive loads.

In another aspect, the LO buffers comprise first and second npn bipolar junction transistor differential input pairs and a plurality of inductive loads. The second npn bipolar junction transistor differential pair of one LO buffer receives the output of the other LO buffer. Each npn bipolar junction transistor of the differential input pairs is coupled to at least one of the plurality of inductive loads.

In another aspect, the LO buffers comprise first and second pnp bipolar junction transistor differential input pairs and a plurality of inductive loads. The second pnp bipolar junction transistor differential pair of one LO buffer receives the output of the other LO buffer. Each pnp bipolar junction transistor of the differential input pairs is coupled to at least one of the plurality of inductive loads.

DETAILED DESCRIPTION

Figure 1:
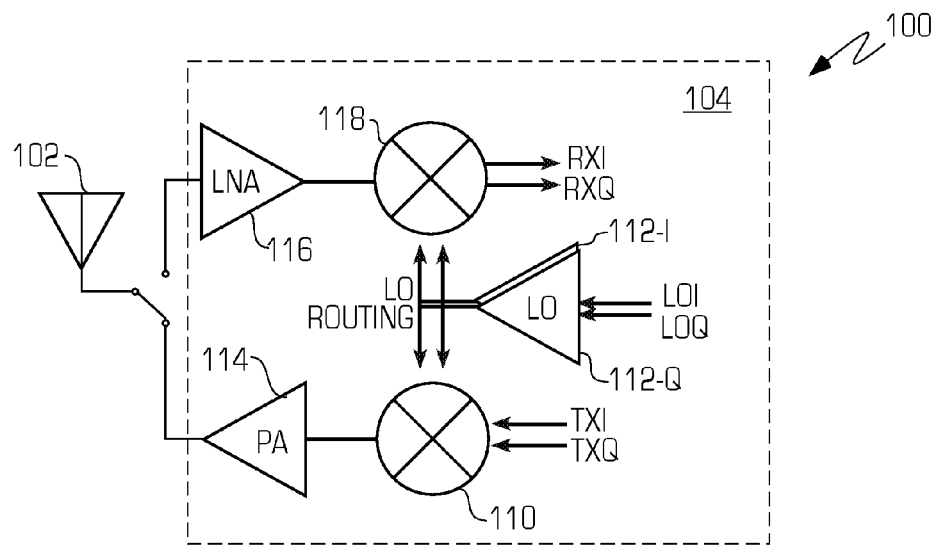
FIG. 1 is a block diagram of a direct conversion radio frequency (RF) transceiver in accordance with various aspects of the innovations herein.

FIG. 1 is a block diagram illustrating a direct conversion RF transceiver system 100. The RF transceiver system 100 comprises an antenna 102 and a transceiver 104. The transceiver 104 comprises an up conversion mixer 110, a plurality of local oscillator (LO) buffers 112-I and 112-Q, a power amplifier (PA) 114, a low noise amplifier (LNA) 116, and a down conversion mixer 118. The local oscillator buffers 112-I and 112-Q provide in-phase and quadrature local oscillator signals, respectively, to the up conversion mixer 110 and the down conversion mixer 118. During transmission, the up conversion mixer 110 mixes the in-phase and quadrature local oscillator signals with an in-phase transmission signal TXI and a quadrature transmission signal TXQ, to form an up converted transmission signal, which is provided to the power amplifier 114. The amplified up converted transmission signal is provided to the antenna 102 for transmission. During reception, the antenna 102 provides a received signal to the low noise amplifier 116. The amplified received signal is mixed in the down conversion mixer 118 with the in-phase and quadrature local oscillator signals to form an in-phase receive signal RXI and the quadrature receive signal RXQ.

Figure 3:
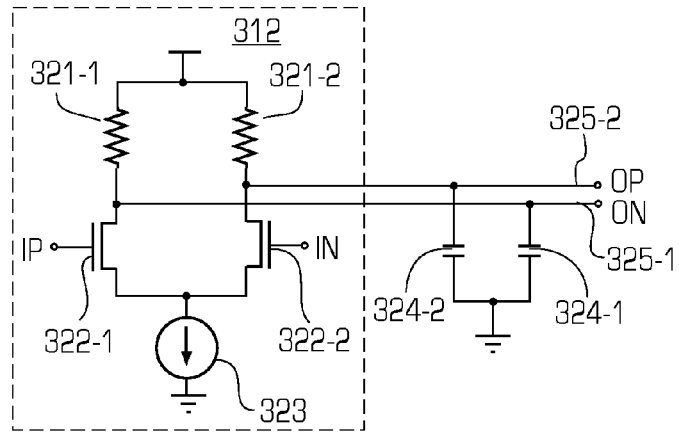
FIG. 3 is a schematic diagram of a conventional resistive load LO buffer of the RF transceiver of FIG. 1.
Figure 4:
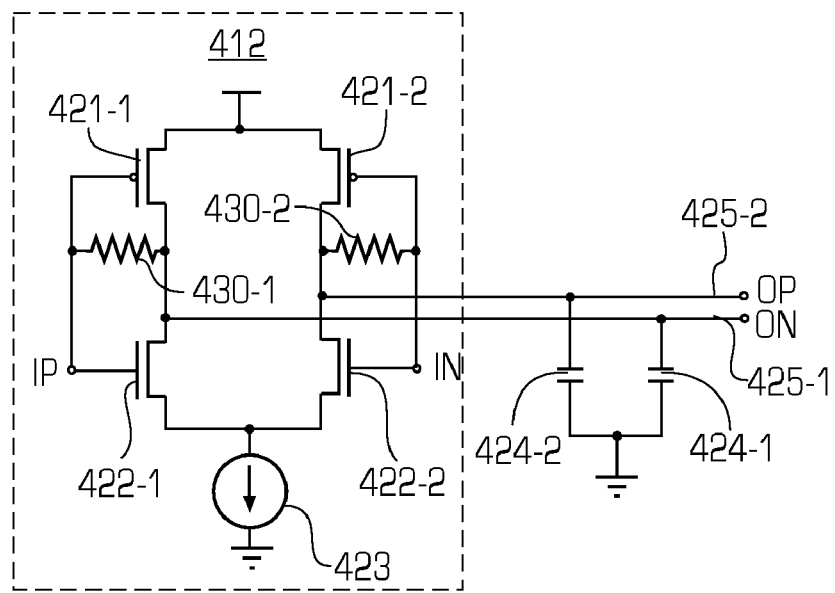
FIG. 4 is a schematic diagram of a conventional CMOS LO buffer of the RF transceiver of FIG. 1.

In one embodiment, the local oscillator buffers 112 may be conventional LO buffers, such as conventional inductive load LO buffers 212 (FIG. 2), conventional resistive load LO buffers 312 (FIG. 3), or conventional CMOS LO buffers 412 (FIG. 4).

In another embodiment, the local oscillator buffers 112 may be a cross coupled local oscillator buffer 512 (FIG. 5) or the various aspects of the cross coupled local oscillator buffer 512 as described in conjunction with FIGS. 6-9. The cross coupled LO buffers 512 decrease or correct the LO IQ mismatch introduced by, for example, a non ideal layout, mismatched capacitance of the LO lines, LO buffer mismatch, or input quadrature mismatch.

As an illustrative example, the performance of the RF transceiver 100 is described at a 5 GHz frequency.

Figure 2:
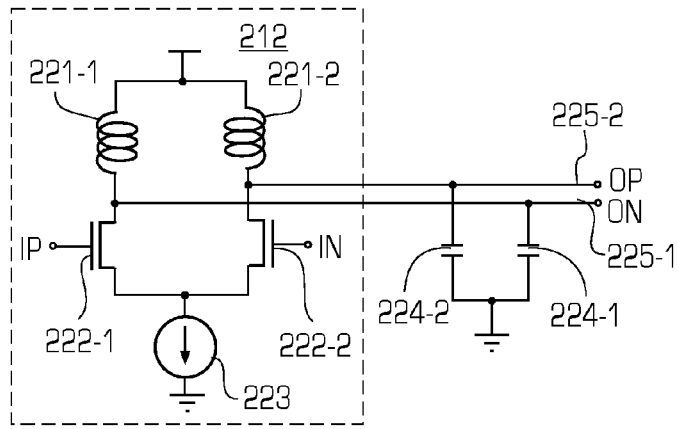
FIG. 2 is a schematic diagram of a conventional inductive load LO buffer of the RF transceiver of FIG. 1.

FIG. 2 is a schematic diagram of a conventional inductive load LO buffer 212. The conventional inductive load LO buffer 212 comprises a plurality of inductors 221-1 and 221-2, a plurality of NMOS transistors 222-1 and 222-2 and a current source 223. The conventional inductive load LO buffer 200 has outputs (ON) 225-1 and (OP) 225-2 that have capacitances 224-1 and 224-2, respectively. The NMOS transistors 222 are arranged as a differential input pair. The inductors 221 provide inductive loads to drive a sufficient signal swing in a high frequency domain. The conventional inductive load LO buffer 212 may deliver sufficient LO signal strength with small current consumption; however, the delivered LO signals are very sensitive to the mismatched capacitance in the LO lines and also it cannot correct the input quadrature mismatch.

A small imbalanced capacitance introduces large phase and amplitude mismatch in the LO signals. In the illustrative example of a transceiver operating at 5 GHz, a 1% imbalanced capacitance in the LO lines introduces more than a five degree phase mismatch and a 0.11 dB amplitude mismatch in the LO.

FIG. 3 is a schematic diagram of a conventional resistive load LO buffer 312. The conventional resistive load LO buffer 300 comprises a plurality of resistors 321-1 and 321-2, a plurality of NMOS transistors 322-1 and 322-2 and a current source 323. The conventional resistive load LO buffer 300 has outputs (ON) 325-1 and (OP) 325-2 that have capacitances 324-1 and 324-2, respectively. The NMOS transistors 322 are arranged as a differential input pair. The resistors 321 provide a resistive load to drive a sufficient signal swing in a high frequency domain.

In the illustrative example of a transceiver operating at 5 GHz, the conventional resistive load LO buffer 312 has a current consumption of 23.4 milliamps, which is about ten times higher than the conventional inductive LO buffer 212. However, the introduced I/Q mismatch is smaller. In the illustrative example, a 1% capacitance imbalance introduces a 0.2 degree phase mismatch and a 0.08 dB amplitude mismatch. The conventional resistive load LO buffer 312 has less sensitivity to the mismatched capacitance in LO lines than the conventional inductive load LO buffer 212, and thus introduces less quadrature mismatch. Further, the conventional resistor load LO buffer 312 cannot handle ultra high speed operation.

FIG. 4 is a schematic diagram of a conventional CMOS LO buffer 412. The conventional CMOS LO buffer 412 comprises a plurality of PMOS transistors 421-1 and 421-2, a plurality of NMOS transistors 422-1 and 422-2, a current source 423, and a plurality of resistors 430-1 and 430-2. The conventional CMOS LO buffer 412 has outputs (ON) 425-1 and (OP) 425-2 that have capacitances 424-1 and 424-2, respectively. The NMOS transistors 422 are arranged as a differential input pair. The NMOS transistors 421 provide a load to drive the LO signal.

In the illustrative example of a transceiver operating at 5 GHz, the conventional CMOS LO buffer 412 has a current consumption of 25 mA, which is much higher than the current consumption of the conventional inductive load LO buffer 212. However, the introduced I/Q mismatch is smaller. The conventional CMOS LO buffer 412 is also sensitive to the imbalanced capacitance, whose sensitivity is similar to the conventional resistive load LO buffer 312. In the illustrative example of 5 GHz, a 1% capacitance imbalance introduces a 0.1 degree phase mismatch and 0.07 dB amplitude mismatch. The conventional CMOS type LO buffer 412 also has less sensitivity to the mismatch capacitance in LO lines and introduces less quadrature mismatch. The conventional CMOS type LO buffer 412 also has the same problem as the resistive load LO buffer 312 for current consumption and cannot drive an ultra high speed signal, such as signals above 4.5 GHz.

Figure 5:
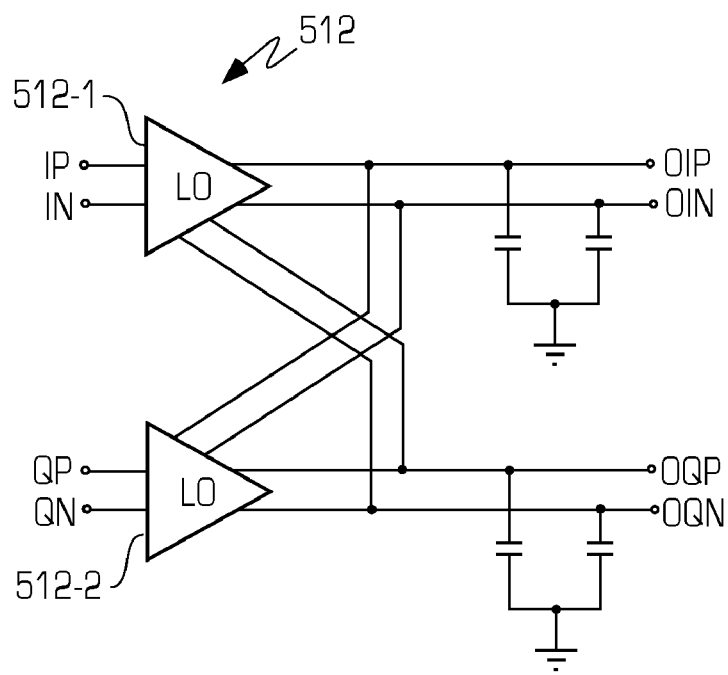
FIG. 5 is a schematic diagram illustrating a cross coupled local oscillator (LO) buffer circuit of the direct conversion radio frequency (RF) transceiver of FIG. 1 in accordance with various aspects of the innovations herein.

FIG. 5 is a schematic diagram illustrating a cross coupled LO buffer 512 in accordance with various aspects of the innovations herein. The cross coupled LO buffer 512 includes a close loop to correct the phase difference between the in-phase LO buffer 512-1 and the quadrature LO buffer 512-2 to reduce the quadrature phase difference between the LO branches, and reduce the amplitude mismatch of the LO signals, and correct the input quadrature mismatch. The cross coupled LO buffer 612 may have low power consumption in various applications, such as RF transceivers.

The cross coupled LO buffer 512 comprises an in-phase LO buffer 512-1 that buffers in-phase LO signals IP and IN, and also comprises a quadrature LO buffer 512-2 that buffers quadrature LO signals QP and QN. In response to in-phase signals IP and IN and the quadrature LO signals OQP and OQN that are fed back from the output of the quadrature LO buffer 512-2, the in-phase LO buffer 512-1 generates in-phase output signals OIP and OIN. The in-phase output signals OIP and OIN are also provided to the quadrature LO buffer 512-2. In response to the in-phase output signals OIP and OIN from the in-phase LO buffer 512-1 and the quadrature LO signals QP and QN, the quadrature LO buffer 512-2 generates the quadrature output signals OQP and OQN.

The LO buffers 512 may include, for example, a cross coupled LO buffer 612 (FIG. 6), a cross coupled LO buffer 712 (FIG. 7), a cross coupled LO buffer 812 (FIG. 8), or a cross coupled LO buffer 912 (FIG. 9), which are described below.

In one embodiment, the cross coupled LO buffer 512 operates at high frequencies. In one aspect, the high frequencies are microwave frequencies or above. In another aspect, the high frequencies are microwave frequencies. In yet another aspect, the high frequencies are above 4.5 GHz. In one embodiment, each of the cross coupled LO buffers 512-1 and 512-2 includes a high frequency inductive load circuit.

In one embodiment, the cross coupled LO buffer 512 is included in a wide band high frequency LO driver.

In one embodiment, the cross coupled LO buffer 512 has very low power consumption, uses a very small chip area, and may be simply implemented in the correction circuit. Further, the cross coupled LO buffer 512 adjusts the phase and amplitude match without running a calibration.

Figure 6:
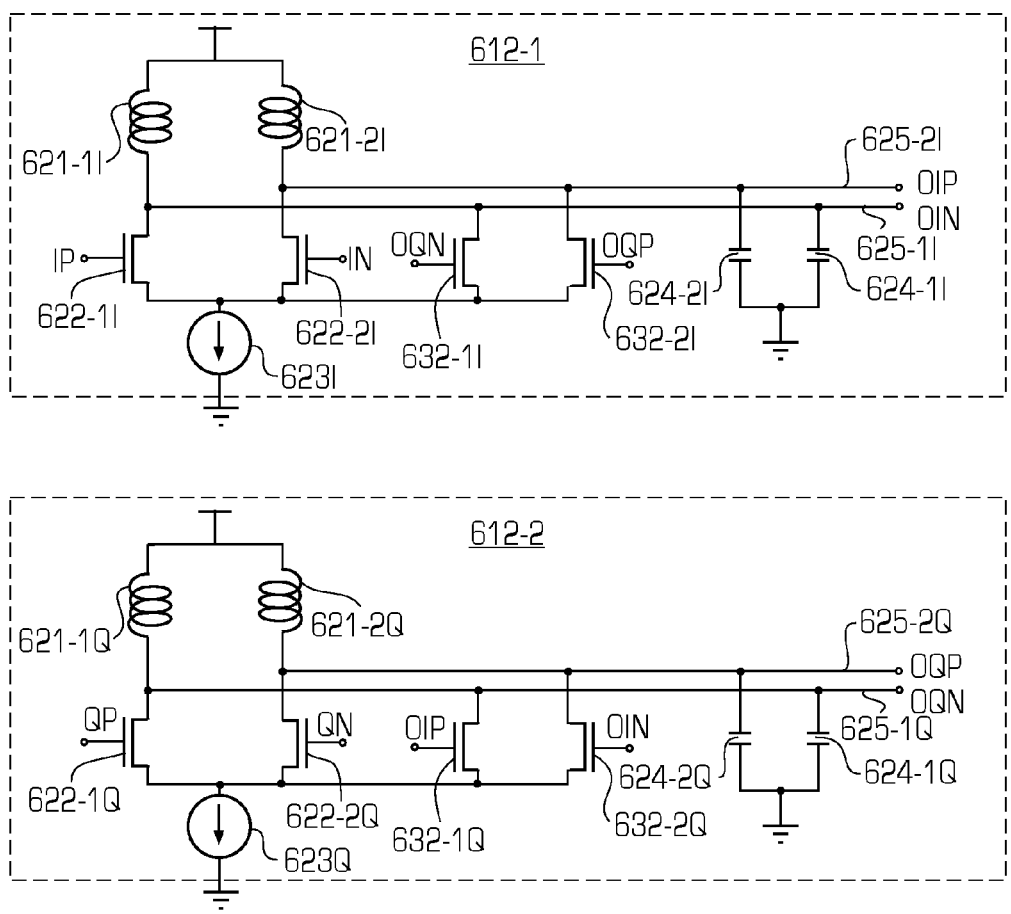
FIG. 6 is a schematic diagram illustrating one embodiment of the LO buffers of FIG. 5.

FIG. 6 is a schematic diagram illustrating a cross coupled LO buffer 612. The cross coupled LO buffer 612 comprises an in-phase LO buffer 612-1 and a quadrature LO buffer 612-2. The LO buffers 612 are inductive load buffers that include NMOS transistors. The cross coupled LO buffer 612 includes a plurality of NMOS differential input pairs, which are cross coupled to adjust the phase and amplitude matching of the in-phase and quadrature output signals.

The in-phase LO buffer 612-1 comprises a plurality of inductors 621-1I and 621-2I, a plurality of NMOS transistors 622-1I, 622-2I, 632-1I and 632-2I, and a current source 623I. The NMOS transistors 622-1I and 622-2I are arranged as a differential input pair. The inductors 621-1I and 621-2I provide inductive loads. The in-phase LO buffer 612-1 has in-phase outputs (OIN) 625-1I and (OIP) 625-2I that have capacitances 624-1I and 624-2I, respectively. The NMOS transistors 632-1I and 632-2I are arranged as a differential input pair to receive the quadrature output signals 625-1Q and 622-2Q, respectively, from the output of the quadrature LO buffer 612-2.

The quadrature LO buffer 612-2 comprises a plurality of inductors 621-1Q and 621-2Q, a plurality of NMOS transistors 622-1Q, 622-2Q, 632-1Q and 632-2Q, and a current source 623Q. The NMOS transistors 622-1Q and 622-2Q are arranged as a differential input pair. The inductors 621-1Q and 621-2Q provide inductive loads. The quadrature LO buffer 612-2 has quadrature outputs (OQN) 625-1Q and (OQP) 625-2Q that have capacitances 624-1Q and 624-2Q, respectively. The NMOS transistors 632-1Q and 632-2Q are arranged as a differential input pair to receive the in-phase output signals 625-1I and 622-2I, respectively, from the output of the in-phase LO buffer 612-1. For clarity and simplicity, the cross coupling of the signal lines of the output signals 625 between the buffers 612 are not shown in FIG. 6, but are shown in FIG. 5.

The signal path through the NMOS transistors 622 and 632 is a multiple of three hundred sixty degrees. In one embodiment, the NMOS transistors 622 and 632 are matched, and thus, the signal path through each of the NMOS transistors 622 and 632 is 90 degrees.

Figure 7:
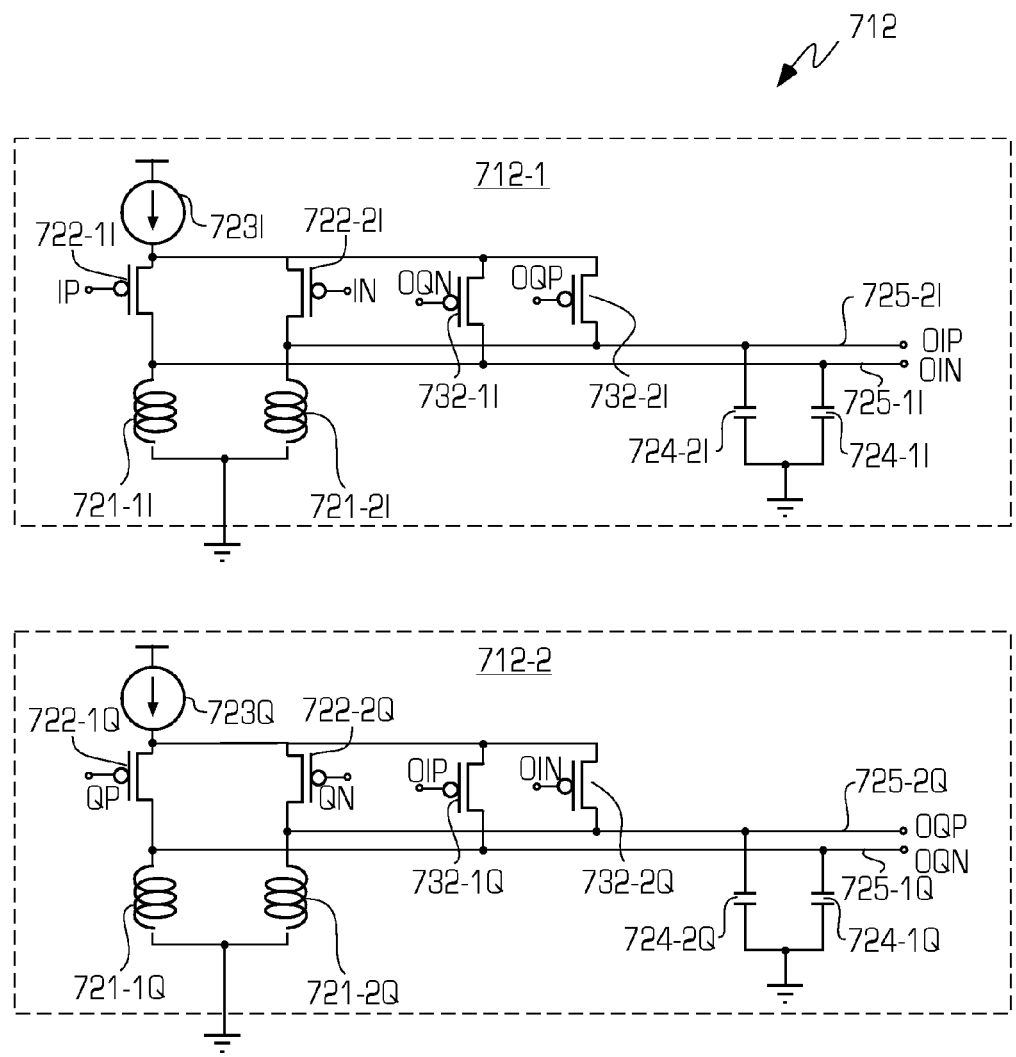
FIG. 7 is a schematic diagram illustrating a second embodiment of the cross coupled LO buffer of FIG. 5.

FIG. 7 is a schematic diagram illustrating a cross coupled LO buffer 712. The cross coupled LO buffer 712 includes a plurality of PMOS differential input pairs, which are cross coupled to adjust the phase and amplitude matching of the in-phase and quadrature output signals. The cross coupled LO buffer 712 comprises an in-phase LO buffer 712-1 and a quadrature LO buffer 712-2. The LO buffers 712 are inductive load buffers that include PMOS transistors.

The in-phase LO buffer 712-1 comprises a plurality of inductors 721-1I and 721-2I, a plurality of PMOS transistors 722-1I, 722-2I, 732-1I and 732-2I, and a current source 723I. The PMOS transistors 722-1I and 722-2I are arranged as a differential input pair. The inductors 721-1I and 721-2I provide inductive loads. The in-phase LO buffer 712-1 has in-phase outputs (OIN) 725-1I and (OIP) 725-2I that have capacitances 724-1I and 724-2I, respectively. The PMOS transistors 732-1I and 732-2I are arranged as a differential input pair to receive the quadrature output signals 725-1Q and 722-2Q, respectively, from the output of the quadrature LO buffer 712-2.

The quadrature LO buffer 712-2 comprises a plurality of inductors 721-1Q and 721-2Q, a plurality of PMOS transistors 722-1Q, 722-2Q, 732-1Q and 732-2Q, and a current source 723Q. The PMOS transistors 722-1Q and 722-2Q are arranged as a differential input pair. The inductors 721-1Q and 721-2Q provide inductive loads. The quadrature LO buffer 712-2 has outputs (OQN) 725-1Q and (OQP) 725-2Q that have capacitances 724-1Q and 724-2Q, respectively. The PMOS transistors 732-1Q and 732-2Q are arranged as a differential input pair to receive the in-phase output signals 725-1I and 722-2I, respectively, from the output of the in-phase LO buffer 712-1. For clarity and simplicity, the cross coupling of the signal lines of the output signals 725 between the buffers 712 are not shown in FIG. 7, but are shown in FIG. 5.

The signal path through the PMOS transistors 722 and 732 is a multiple of three hundred sixty degrees. In one embodiment, the PMOS transistors 722 and 732 are matched, and thus, the signal path through each of the PMOS transistors 722 and 732 is 90 degrees.

Figure 8:
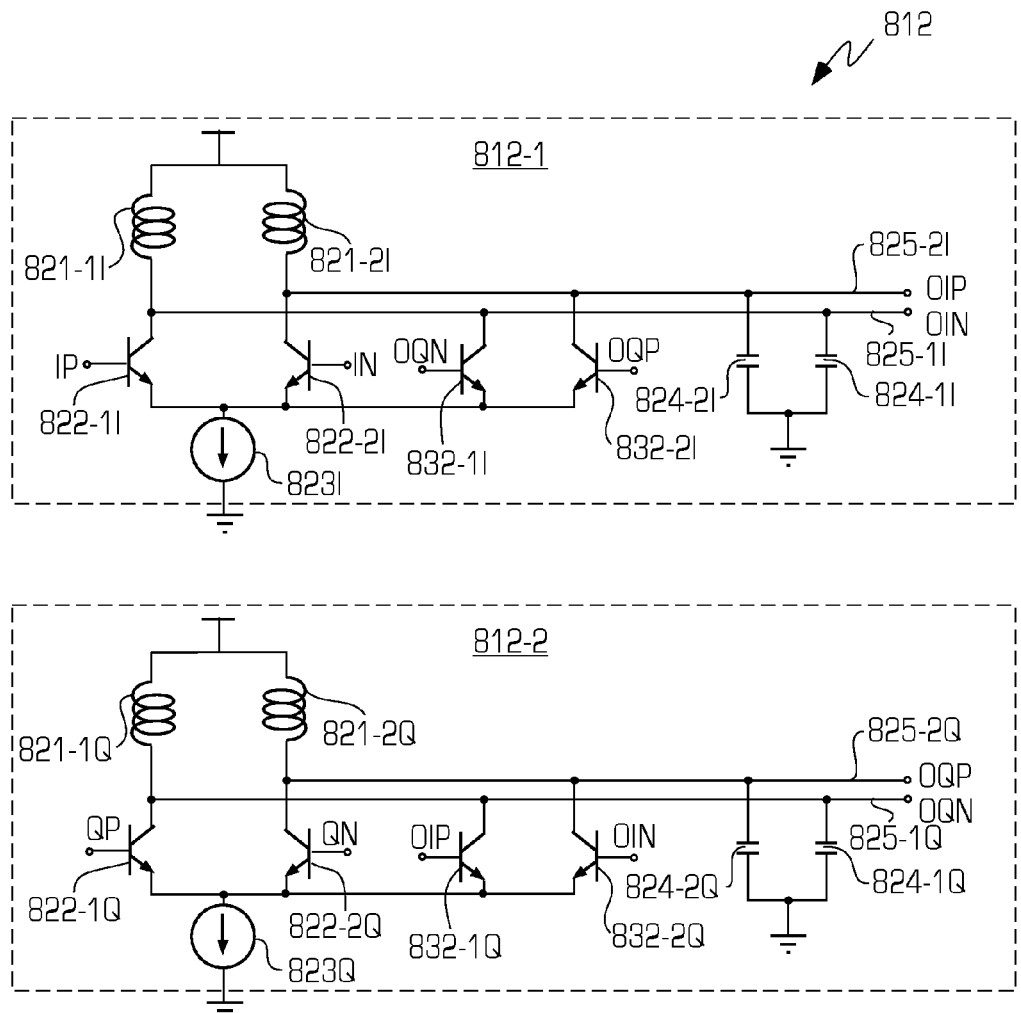
FIG. 8 is a schematic diagram illustrating a third embodiment of the cross coupled LO buffer of FIG. 5.

FIG. 8 is a schematic diagram illustrating a cross coupled LO buffer 812. The cross coupled LO buffer 812 includes a plurality of npn bipolar junction transistor differential input pairs, which are cross coupled to adjust the phase and amplitude matching of the in-phase and quadrature output signals. The cross coupled LO buffer 812 comprises an in-phase LO buffer 812-1 and a quadrature LO buffer 812-2. The LO buffers 812 are inductive load buffers that include npn bipolar junction transistors.

The in-phase LO buffer 812-1 comprises a plurality of inductors 821-1I and 821-2I, a plurality of npn bipolar junction transistors 822-1I, 822-2I, 832-1I and 832-2I, and a current source 823I. The npn bipolar junction transistors 822-1I and 822-2I are arranged as a differential input pair. The inductors 821-1I and 821-2I provide inductive loads. The in-phase LO buffer 812-1 has in-phase outputs (OIN) 825-1I and (OIP) 825-2I that have capacitances 824-1I and 824-2I, respectively. The npn bipolar junction transistors 832-1I and 832-2I are arranged as a differential input pair to receive the quadrature output signals 825-1Q and 822-2Q, respectively, from the output of the quadrature LO buffer 812-2.

The quadrature LO buffer 812-2 comprises a plurality of inductors 821-1Q and 821-2Q, a plurality of npn bipolar junction transistors 822-1Q, 822-2Q, 832-1Q and 832-2Q, and a current source 823Q. The npn bipolar junction transistors 822-1Q and 822-2Q are arranged as a differential input pair. The inductors 821-1Q and 821-2Q provide inductive loads. The quadrature LO buffer 812-2 has quadrature outputs (OQN) 825-1Q and (OQP) 825-2Q that have capacitances 824-1Q and 824-2Q, respectively. The npn bipolar junction transistors 832-1Q and 832-2Q are arranged as a differential input pair to receive the in-phase output signals 825-1I and 822-2I, respectively, from the output of the in-phase LO buffer 812-1. For clarity and simplicity, the cross coupling of the signal lines of the output signals 825 between the buffers 812 are not shown in FIG. 8, but are shown in FIG. 5.

The signal path through the npn bipolar junction transistors 822 and 832 is a multiple of three hundred sixty degrees. In one embodiment, the npn bipolar junction transistors 822 and 832 are matched, and thus, the signal path through each of the npn bipolar junction transistors 822 and 832 is 90 degrees.

Figure 9:
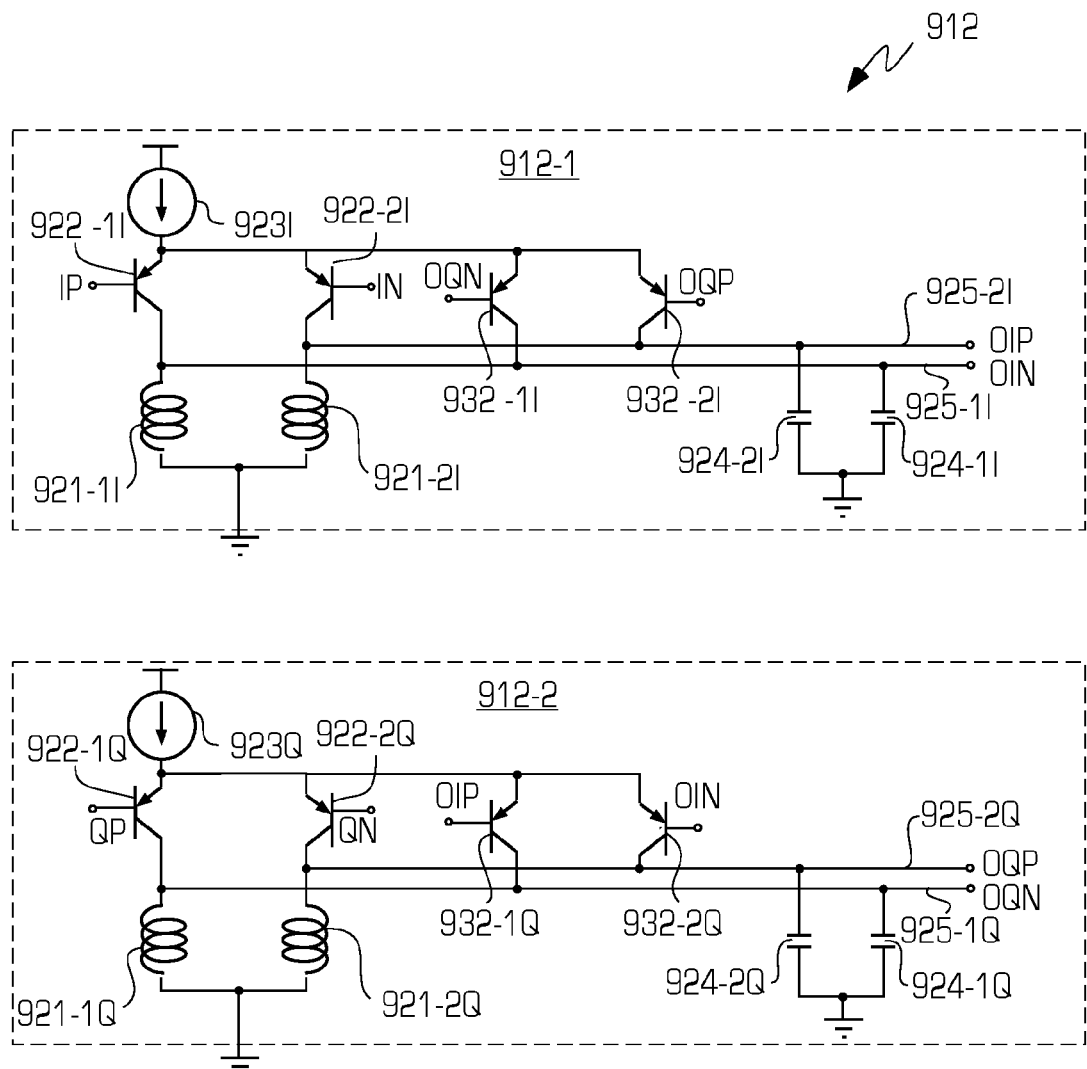
FIG. 9 is a schematic diagram illustrating a fourth embodiment of the cross coupled LO buffer of FIG. 5.

FIG. 9 is a schematic diagram illustrating a cross coupled LO buffer 912. The cross coupled LO buffer 912 includes a plurality of pnp bipolar junction transistor differential input pairs, which are cross coupled to adjust the phase and amplitude matching of the in-phase and quadrature output signals. The cross coupled LO buffer 912 comprises an in-phase LO buffer 912-1 and a quadrature LO buffer 912-2. The LO buffers 912 are inductive load buffers that include pnp bipolar junction transistors.

The in-phase LO buffer 912-1 comprises a plurality of inductors 921-1I and 921-2I, a plurality of pnp bipolar junction transistors 922-1I, 922-2I, 932-1I and 932-2I, and a current source 923I. The pnp bipolar junction transistors 922-1I and 922-2I are arranged as a differential input pair. The inductors 921-1I and 921-2I provide inductive loads. The LO buffer 912-1 has in-phase outputs (OIN) 925-1I and (OIP) 925-2I that have capacitances 924-1I and 924-2I, respectively. The pnp bipolar junction transistors 932-1I and 932-2I are arranged as a differential input pair to receive the quadrature output signals 925-1Q and 922-2Q, respectively, from the output of the quadrature LO buffer 912-2.

The quadrature LO buffer 912-2 comprises a plurality of inductors 921-1Q and 921-2Q, a plurality of pnp bipolar junction transistors 922-1Q, 922-2Q, 932-1Q and 932-2Q, and a current source 923Q. The pnp bipolar junction transistors 922-1Q and 922-2Q are arranged as a differential input pair. The inductors 921-1Q and 921-2Q provide inductive loads. The quadrature LO buffer 912-2 has in-phase outputs (OQN) 925-1Q and (OQP) 925-2Q that have capacitances 924-1Q and 924-2Q, respectively. The pnp bipolar junction transistors 932-1Q and 932-2Q are arranged as a differential input pair to receive the in-phase output signals 925-1I and 922-2I, respectively, from the output of the in-phase LO buffer 912-1. For clarity and simplicity, the cross coupling of the signal lines of the output signals 925 between the buffers 912 are not shown in FIG. 9, but are shown in FIG. 5.

The signal path through the pnp bipolar junction transistors 922 and 932 is a multiple of three hundred sixty degrees. In one embodiment, the pnp bipolar junction transistors 922 and 932 are matched, and thus, the signal path through each of the pnp bipolar junction transistors 922 and 932 is 90 degrees.

In the foregoing description, various methods and apparatus, and specific embodiments are described. However, it should be obvious to one conversant in the art, various alternatives, modifications, and changes may be possible without departing from the spirit and the scope of the invention which is defined by the metes and bounds of the appended claims.

What is claimed is:

1. A LO buffer circuit comprising:
a first LO buffer including a high frequency inductive load circuit and including first and second input terminals for receiving first and second in-phase input signals, respectively, including first and second feed back input terminals for receiving first and second quadrature output signals, respectively, and including first and second output signal terminals for providing first and second in-phase output signals, respectively; and
a second LO buffer including an inductive load circuit including first and second input terminals for receiving first and second quadrature input signals, including first and second feed back input terminals for receiving the first and second in-phase output signals, respectively, and including first and second output terminals for providing the first and second quadrature output signals.

2. The LO buffer circuit of claim 1 wherein each of the first and second LO buffers comprises a MOS transistor differential input pair and the inductive load circuit comprises a plurality of inductive loads, each MOS transistor of the differential input pair being coupled to at least one of the plurality of inductive loads.

3. The LO buffer circuit of claim 1 wherein each of the first and second LO buffers comprises first and second MOS transistor differential input pairs and a plurality of inductive loads, each MOS transistor of the differential input pairs is coupled to at least one of the plurality of inductive loads, the first MOS transistor differential input pair is coupled to the first and second input terminals, the second MOS transistor differential input pair is coupled to the first and second feed back input terminals.

4. The LO buffer circuit of claim 1 wherein each of the first and second LO buffers comprise:
a first inductor including a first terminal coupled to a first voltage terminal and including a second terminal coupled to the second output terminal;
a second inductor including a first terminal coupled to the first voltage terminal and including a second terminal coupled to the first output terminal;
a first MOS transistor including first and second terminals spaced apart with a channel therebetween and including a gate for controlling current in said channel, said first terminal being coupled to the second terminal of the first inductor, said gate being coupled to the first input terminal;
a second MOS transistor including first and second terminals spaced apart with a channel therebetween and including a gate for controlling current in said channel, said first terminal being coupled to the second terminal of the second inductor, said second terminal being coupled to the second terminal of the first MOS transistor to form a first node, said gate being coupled to the second input terminal;
a current source including a first terminal coupled to the first node and including a second terminal coupled to a second voltage terminal;
a third MOS transistor including first and second terminals spaced apart with a channel therebetween and including a gate for controlling current in said channel, said first and second terminals being coupled to the respective first and second terminals of the first MOS transistor, the gate being coupled to the first feedback input terminal; and
a fourth MOS transistor including first and second terminals spaced apart with a channel therebetween and including a gate for controlling current in said channel, said first and second terminals being coupled to the respective first and second terminals of the second MOS transistor, the gate being coupled to the second feedback input terminal.

5. The LO buffer circuit of claim 4 wherein the first, second, third and fourth MOS transistors are NMOS transistors.

6. The LO buffer circuit of claim 1 wherein each of the first and second LO buffers comprises:
a current source including a first terminal coupled to a first voltage terminal and including a second terminal;
a first MOS transistor including first and second terminals spaced apart with a channel therebetween and including a gate for controlling current in said channel, said first terminal being coupled to the second terminal of the current source, said second terminal being coupled to the second output terminal, said gate being coupled to the first input terminal;
a second MOS transistor including first and second terminals spaced apart with a channel therebetween and including a gate for controlling current in said channel, said first terminal being coupled to the second terminal of the current source, said second terminal being coupled to the first output terminal, said gate being coupled to the second input terminal;
a first inductor including a first terminal coupled to the second terminal of the first MOS transistor and including a second terminal coupled to a second voltage terminal;
a second inductor including a first terminal coupled to the second terminal of the second MOS transistor and including a second terminal coupled to the second voltage terminal;
a third MOS transistor including first and second terminals spaced apart with a channel therebetween and including a gate for controlling current in said channel, said first and second terminals being coupled to the respective first and second terminals of the first MOS transistor, said gate being coupled to the first feedback terminal; and
a fourth MOS transistor including first and second terminals spaced apart with a channel therebetween and including a gate for controlling current in said channel, said first and second terminals being coupled to the respective first and second terminals of the second MOS transistor, said gate being coupled to the second feedback terminal.

7. The LO buffer circuit of claim 6 wherein the first, second, third and fourth MOS transistors are PMOS transistors.

8. The LO buffer circuit of claim 1 wherein each of the first and second LO buffers comprises a npn bipolar junction transistor differential input pair and a plurality of inductive loads, each npn bipolar junction transistor of the differential input pair is coupled to at least one of the plurality of inductive loads.

9. The LO buffer circuit of claim 1 wherein each of the first and second LO buffers comprises first and second npn bipolar junction transistor differential input pairs and a plurality of inductive loads, each npn bipolar junction transistor of the differential input pairs is coupled to at least one of the plurality of inductive loads, the first npn bipolar junction transistor differential input pair is coupled to the first and second input terminals, the second npn bipolar junction transistor differential input pair is coupled to the first and second feed back input terminals.

10. The LO buffer circuit of claim 1 wherein each of the first and second LO buffers comprises:
- a first inductor including a first terminal coupled to a first voltage terminal and including a second terminal coupled to the second output terminal;
- a second inductor including a first terminal coupled to the first voltage terminal and including a second terminal coupled to the first output terminal;
- a first npn bipolar junction transistor including an emitter, including a collector coupled to the second terminal of the first inductor, and including a base coupled to the first input terminal;
- a second npn bipolar junction transistor including an emitter coupled to the emitter of the first npn bipolar junction transistor, including a collector coupled to the second terminal of the second inductor, and including a the base coupled to the second input terminal;
- a current source including a first terminal coupled to a node formed of the emitters of the first and second npn bipolar junction transistor and including a second terminal coupled to a second voltage terminal;
- a third npn bipolar junction transistor including an emitter coupled to the emitter of the first bipolar junction transistor, including a collector coupled to the collector of the first bipolar junction transistor, and including a base coupled to the first feedback input terminal; and
- a fourth bipolar junction transistor including an emitter coupled to the emitter of the second npn bipolar junction transistor, including a collector coupled to the collector of the second npn bipolar transistor, and including a base being coupled to the second feedback input terminal.

11. The LO buffer circuit of claim 1 wherein each of the first and second LO buffers comprises a pnp bipolar junction transistor differential input pair and a plurality of inductive loads, each pnp bipolar junction transistor of the differential input pair is coupled to at least one of the plurality of inductive loads.

12. The LO buffer circuit of claim 1 wherein each of the first and second LO buffers comprises first and second pnp bipolar junction transistor differential input pairs and a plurality of inductive loads, each pnp bipolar junction transistor of the differential input pairs is coupled to at least one of the plurality of inductive loads, the first pnp bipolar junction transistor differential input pair is coupled to the first and second input terminals, the second pnp bipolar junction transistor differential input pair is coupled to the first and second feed back input terminals.

13. The LO buffer circuit of claim 1 wherein each of the first and second LO buffers comprises:
- a current source including a first terminal coupled to a first voltage terminal and including a second terminal;
- a first pnp bipolar junction transistor including an emitter coupled to the second terminal of the current source, including a collector coupled to the second output terminal, and including a base coupled to the first input terminal;
- a second pnp bipolar junction transistor including an emitter coupled to the emitter of the first pnp bipolar junction transistor, including a collector coupled to the first output terminal, and including a base coupled to the second input terminal;
- a first inductor including a first terminal coupled to the collector of the first pnp bipolar junction transistor and including a second terminal coupled to a second voltage terminal;
- a second inductor including a first terminal coupled to the collector of the second pnp bipolar junction transistor and including a second terminal coupled to the second voltage terminal;
- a third pnp bipolar junction transistor including an emitter coupled to the emitter of the first pnp bipolar junction transistor, including a collector coupled to the collector of the first pnp bipolar junction transistor, and including a base coupled to the first feedback terminal; and
- a fourth pnp bipolar junction transistor including an emitter coupled to the emitter of the second pnp bipolar junction transistor, including a collector coupled to the collector of the second pnp bipolar junction transistor, and including a base coupled to the second feedback terminal.

* * * * *